(12) United States Patent
Sankar et al.

(10) Patent No.: US 7,510,997 B1
(45) Date of Patent: Mar. 31, 2009

(54) CONDUCTIVE AND ROBUST NITRIDE BUFFER LAYERS ON BIAXIALLY TEXTURED SUBSTRATES

(75) Inventors: Sambasivan Sankar, Chicago, IL (US); Amit Goyal, Knoxville, TN (US); Scott A. Barnett, Evanston, IL (US); Ilwon Kim, Skokie, IL (US); Donald M. Kroeger, Knoxville, TN (US)

(73) Assignees: Applied Thin Films, Inc., Evanston, IL (US); UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 10/919,630

(22) Filed: Aug. 17, 2004

Related U.S. Application Data

(62) Division of application No. 09/895,866, filed on Jun. 29, 2001, now Pat. No. 6,784,139.

(60) Provisional application No. 60/217,157, filed on Jul. 10, 2000.

(51) Int. Cl.
*H01L 39/24* (2006.01)

(52) U.S. Cl. .............. 505/325; 505/330; 505/410; 505/412; 427/62; 427/537; 427/597

(58) Field of Classification Search .......... 505/325, 505/330, 410, 412, 430, 434, 440, 470, 474, 505/476, 480, 731, 732, 735, 739; 427/62, 427/537, 597, 123, 126.1, 126.3, 225.394, 427/419.1–419.4, 419.7
See application file for complete search history.

(56) References Cited

U.S. PATENT DOCUMENTS

| | | | |
|---|---|---|---|
| 4,768,069 A * | 8/1988 | Talvacchio et al. ............ 257/32 |
| 4,933,058 A * | 6/1990 | Bache et al. ............. 204/192.3 |
| 5,739,086 A | 4/1998 | Goyal et al. |
| 5,741,377 A | 4/1998 | Goyal et al. |
| 5,898,020 A | 4/1999 | Goyal et al. |
| 5,942,148 A * | 8/1999 | Preston ................ 252/62.3 GA |
| 5,958,599 A | 9/1999 | Goyal et al. |
| 5,964,966 A * | 10/1999 | Goyal et al. ................. 148/426 |
| 5,968,877 A | 10/1999 | Budai et al. |
| 5,972,847 A | 10/1999 | Feenstra et al. |
| 6,022,832 A * | 2/2000 | Fritzemeier et al. ......... 505/461 |
| 6,077,344 A | 6/2000 | Shoup et al. |
| 6,106,615 A | 8/2000 | Goyal et al. |
| 6,114,287 A | 9/2000 | Lee et al. |
| 6,150,034 A | 11/2000 | Paranthaman et al. |
| 6,159,610 A | 12/2000 | Paranthaman et al. |
| 6,235,402 B1 | 5/2001 | Shoup et al. |
| 6,261,704 B1 | 7/2001 | Paranthaman et al. |
| 6,331,199 B1 | 12/2001 | Goyal et al. |
| 6,447,714 B1 * | 9/2002 | Goyal et al. ................... 419/28 |
| 6,455,108 B1 * | 9/2002 | Muffoletto et al. .......... 427/446 |
| 6,784,139 B1 * | 8/2004 | Sankar et al. ............... 505/237 |

* cited by examiner

*Primary Examiner*—Steven Bos
*Assistant Examiner*—Paul Wartalowicz
(74) *Attorney, Agent, or Firm*—Reinhart Boerner Van Deuren s.c.

(57) ABSTRACT

The present invention relates to epitaxial, electrically conducting and mechanically robust, cubic nitride buffer layers deposited epitaxially on biaxially textured substrates such as metals and alloys. The invention comprises of a biaxially textured substrate with epitaxial layers of nitrides. The invention also discloses a method to form such epitaxial layers using a high rate deposition method as well as without the use of forming gases. The invention further comprises epitaxial layers of oxides on the biaxially textured nitride layer. In some embodiments the article further comprises electromagnetic devices which may have superconducting properties.

9 Claims, 11 Drawing Sheets

(a) (b)

(a)

(b)

CONDUCTIVE AND ROBUST NITRIDE BUFFER LAYERS ON BIAXIALLY TEXTURED SUBSTRATES

This application is a divisional application of and claims priority benefit from application Ser. No. 09/895,866 filed Jun. 29, 2001, now U.S. Pat. No. 6,784,139 and prior provisional patent application No. 60/217,157 filed Jul. 10, 2000, each of which is incorporated herein by reference in its entirety.

The United States Government has rights to this invention pursuant to Contract No. DE-ACO5-000R22725 between the United States Department of Energy and UT-Battelle, LLC and Contract No. F33615.99.C.2967 between the Department of Defense and Applied Thin Films, Inc.

CROSS-REFERENCE TO RELATED APPLICATIONS

The following relate to the present invention and are hereby incorporated by reference in their entirety: U.S. Pat. No. 5,739,086 Structures Having Enhanced Biaxial Texture and Method of Fabricating Same by Goyal et al., issued Apr. 14, 1998; U.S. Pat. No. 5,741,377 Structures Having Enhanced Biaxial Texture and Method of Fabricating Same by Goyal et al., issued Apr. 21, 1998; U.S. Pat. No. 5,898,020 Structures Having biaxial Texture and Method of Fabricating Same by Goyal et al., issued Apr. 27, 1999; U.S. Pat. No. 5,958,599 Structures Having Enhanced Biaxial Texture by Goyal et al., issued Sep. 28, 1999; U.S. Pat. No. 5,964,966 Method of Forming Biaxially Textured Substrates and Devices Thereon by Goyal et al., issued Oct. 21, 1999; and U.S. Pat. No. 5,968,877 High To YBCO Superconductor Deposited on Biaxially Textured Ni Substrate by Budai et al., issued Oct. 19, 1999.

FIELD OF THE INVENTION

The present invention relates to electrically conducting and mechanically robust nitride buffer layers which can be deposited epitaxially on biaxially textured surfaces, metals and alloys. The invention also discloses a method to form such epitaxial layers using high rate deposition methods.

BACKGROUND OF THE INVENTION

Recent emergence of the high-temperature superconducting (HTS) thick-film tape technology is expected to meet the cost, size and performance requirements of superconducting components needed for advanced power applications for the defense and commercial sectors. One of the major potential HTS applications is in the electric power industry.

The $YBa_2Cu_3O_7$ and related ceramic materials (YBCO) have appropriate intrinsic properties in the liquid nitrogen temperature range. However, their properties are drastically affected by grain boundary misorientations. Hence, in order to enable applications of HTS at high temperature and high fields, it is imperative that a biaxially textured, polycrystalline YBCO tape, or related article, be developed which contains a minimal number of high angle grain boundaries.

One of the industrially scalable processes for producing biaxially textured YBCO conductors is by using Rolling Assisted Biaxially Textured Substrates (RABiTS). As described more fully below, a biaxially textured, flexible metal/alloy substrate is formed by conventional thermomechanical processing followed by epitaxial deposition of buffer layer(s), YBCO grown on such substrate often exhibited $J_c$'s over 1 $MA/cm^2$ at 77K. To date, the preferred buffer layers for the RABiTS approach have been the combination of $CeO_2$ and YSZ. However, these oxide buffer layers lack important properties, e.g., electrical and thermal conductivity and mechanical toughness. It has been a challenging engineering task to develop a large-scale continuous process for producing thick (>0.5 µm) crack- and pore-free oxide films. Microcracking in oxide films is commonly observed in thick films due to the brittle nature of the oxide materials. Microcracks in the oxide layer can serve as open paths for oxygen to diffuse and oxidize the underlying metal during subsequent YBCO processing. Finally, the oxide deposition step on the Ni substrates is difficult; high quality films are only obtained by using very low deposition rates. In addition, as with many HTS applications, conductive buffer layers are needed since they would provide electrical coupling of the HTS layer to the underlying metallic tape substrate. This is an important property in order to electrically stabilize the conductor during transient loss of superconductivity in some applications.

Numerous applications of high temperature superconductors, such as transformers, generators and motors require high current carrying, flexible conductors which can sustain magnetic fields above 0.1 T. Due to the thermally activated flux flow, the critical current density of most of the highly anisotropic superconducting compounds, such as the Bi-based compounds, rapidly drops at 77K in the presence of an externally applied magnetic field. Moreover, it is not clear if the uniaxially textured, Bi-based wires which typically contain numerous high angle grain boundaries and have approximately ⅔ of their cross-sectional area occupied by silver, will ever reach adequate cost/performance levels for large scale commercial applications. Hence, the development of a viable and low cost processing route based on (Y or Re)$Ba_2Cu_3Ox$ (YBCO) is of great interest currently and forms a central research thrust in the area of high temperature superconductivity, YBCO compounds have favorable intrinsic properties. Epitaxial YBCO thin films on single-crystal substrates yield critical current densities ($J_c$'s) in the range of $10^6$-$10^7$ $A/cm^2$ at 77K, 0 T. YBCO films also have a high irreversibility field of ~6 T at 77K.

Conventional ceramic fabrication methods which can be used to make a long, flexible conductor result in materials with weak, if any, macroscopic or microscopic biaxial texture. In particular, YBCO materials fabricated using conventional techniques invariably contain numerous high angle grain boundaries. High angle grain boundaries act as Josephson coupled weak-links leading to a significant field-dependent suppression of the supercurrent across the boundary. For clean stoichiometric boundaries, the grain boundary critical current density depends primarily on the grain boundary misorientation. The dependence of $J_c$(gb) on misorientation angle was first determined by Dimos et al. in YBCO for grain boundary types which can be formed in epitaxial films on bicrystal substrates. These include [001] tilt, [100] tilt, and [100] twist boundaries. In each case high angle boundaries were found to be weak-linked. The low $J_c$ observed in randomly oriented polycrystalline HTS fabricated using conventional methods can be understood on the basis that the population of low angle boundaries is small and that frequent high angle boundaries impede long-range current flow. Hence, controlling the grain boundary misorientation distribution towards low angles is key to fabricating high-$J_c$ materials. Practically speaking, this limitation entails the fabrication of biaxially textured superconductors.

Successful fabrication of biaxially textured superconducting wire based on the coated conductor technology, requires optimization of the cost/performance of the HTS conductor.

From a superconducting performance standpoint, a long, flexible, single crystal-like wire is required. From a cost and fabrication standpoint, an industrially scalable, low cost process is required. Both of these critical requirements are met by Rolling-assisted-biaxially-textured-substrates (RABiTS). However, in order for cost/performance for a conductor based on this technology to be optimized, further work needs to be done in the area of buffer layer technology. It is now clear that while it is fairly straightforward to fabricate long lengths of biaxially textured metals or alloys, it is quite difficult to deposit high quality buffer layers using low cost processes. Requirements of buffer layers include—it should provide an effective chemical barrier for diffusion of deleterious elements from the metal to the superconductor, provide a good structural transition to the superconductor, have a high degree of crystallinity, excellent epitaxy with the biaxially textured metal template, have good mechanical properties, high electrical and thermal conductivity and should be able to be deposited at high rates.

Buffer layers of the prior art include use of YSZ and $CeO_2$, typically a configuration of $CeO_2$ (0.01 μm)/YSZ (0.5 μm)/$CeO_2$ (0.01 μm). The purpose of the first buffer layer is to provide a good epitaxial oxide layer on the reactive, biaxially textured Ni substrate without the formation of undesirable NiO. $CeO_2$ is special in its ability to very readily form single orientation cube-on-cube epitaxy on cube textured Ni. Deposition of $CeO_2$ using a range of deposition techniques is done using a background of forming gas (4% $H_2$-96% Ar) in the presence of small amounts of water vapor. Under such conditions the formation of NiO is thermodynamically unfavorable while the formation of $CeO_2$ is thermodynamically favorable. The water vapor provides the necessary oxygen to form stoichiometric $CeO_2$. It is not possible to deposit YSZ under such conditions with no evidence of undesirable orientations. In the case of $CeO_2$ one can readily obtain a single orientation, sharp cube texture. Ideally, it would be desired that the $CeO_2$ layer be grown thick such that it also provides a chemical diffusion barrier from Ni, followed by deposition of YBCO. However, when the $CeO_2$ layer is grown greater than 0.2 μm in thickness, it readily forms micro-cracks. Hence a YSZ which does provide an excellent chemical barrier to diffusion of Ni and does not crack when grown thick is deposited on a thin initial template of $CeO_2$. Initial demonstrations at ORNL were using this configuration. However, since there is a significant lattice mismatch between YSZ and YBCO (~5%), a second 45°-rotated orientation nucleates at times. In order to avoid the nucleation of this second orientation completely, a thin $CeO_2$ layer is deposited epitaxially on the YSZ layer. This completes the buffer layer structure. YBCO can now be deposited on the layer which has an excellent lattice match with YBCO (~0.1%).

The drawbacks of this buffer layer structure are that the deposition of the first $CeO_2$ layer is non-trivial. Strict control of deposition conditions in particular, the $O_2$ partial pressure is required to avoid formation of undesirable NiO (NiO typically nucleates in mixed orientations and is also very brittle). Furthermore, $CeO_2$ can have wide range of oxygen stoichiometry. It is brittle and is not conducting. It will be a challenging engineering task to develop a large-scale continuous process for producing thick (>0.5 μm) crack- and porosity-free oxide films based on a vapor phase process. For example, in a continuous process involving reactive electron beam evaporation of Ce to form $CeO_2$, issues relating to the formation of an oxide on the target complicate matters relating to rate of deposition as well as stability of the melt pool. Any change of conditions during deposition are known to have profound affects on the film microstructure. Moreover, any oxidation of the biaxially textured metal, even after the successful deposition of $CeO_2$, can induce undesirable interfacial stresses leading to spallation or further cracking, thus deteriorating the material properties. Microcracks in the oxide buffer layer will adversely affect the epitaxial quality of the growing YBCO film and create weak-links, besides serving as diffusion paths for Ni. Lastly, the surface morphology of the buffer layer is important for subsequent YBCO growth. Ideally, it would be desired to have a buffer layer which tends to be smoother than the Ni substrate it is grown on. In other words, the buffer layer has a sharper rocking curve than the underlying substrate. For $CeO_2$ the rocking curve is almost the same as that for the Ni substrate. All things considered, buffer layer deposition of the prior art is time-consuming and qualitatively deficient.

Macroscopically, biaxially textured YBCO conductors have been formed by epitaxial deposition of YBCO on flexible substrates formed by two techniques—(a) A flexible, unoriented, polycrystalline metal substrate coated with an oxide buffer film(s) with a forced biaxial texture induced by ion-beam-assisted-deposition (IBAD), where an assisting noble gas beam extracted from an ion source is directed onto the growing film. A similar biaxial texture is observed during oblique vapor deposition on an inclined polycrystalline substrate and (b) A biaxially textured, flexible metal based substrate formed by conventional thermomechanical processing followed by epitaxial deposition of buffer layer(s). This technique is referred to as Rolling Assisted Biaxially Textured Substrates (RABiTS). Using both these techniques $J_c$'s over 1 $MA/cm^2$ at 77K have been achieved.

The foregoing background information, together with other aspects of the prior art, are disclosed more fully and better understood in light of the following publications:

1. Kormann, G., Bilde, J. H., Sorensen, K., de Reus, R., Anderson R. H, Vace, P., and Fraltoft, T., "Relation between Critical Current Densities and epitaxy of Y-123 Thin Films on Mgo (100) and $SrTiO_3$ (100)," *J. Appl. Phys.,* 1992, 71, 3419-3426.
2. Matsuda, H., Soeta, A., Doi, T., Aikhara, and T. Kamo, "Magnetization and Anisotropy in Single Crystals of Ti-1223 of Tl—Sr—Ca—Cu—O System," *Jpn. J. Appl. Phys.,* 1992, 31, L1229-31.
3. Dimos, D., Chaudhari, P., Mannhart, X., and F. K. LeGoues, "Orientation Dependence of Grain Boundary Critical Currents in $YBa_2Cu_3O_x$ Bicrystals," *Phys. Rev. Lett.,* 1988, 61, 219-222; Dimos, D., Chaudlhari, P., and Mannhart, J., "Superconducting Transport Properties of Grain-boundaries in $YBa_2Cu_3O_x$ Bicrystals", *Phys. Rev. B,* 1990, 41, 4038-4049.
4. Iijima, Y., Tanabe, N., Kohno, O., and Ikeno, Y., "In-plane Aligned $YBa_2Cu_3O_x$ Thin-Films Deposited on Polycrystalline Metallic Substrates," *Appl. Phys. Lett.,* 1992, 60, 769-771.
5. Reades, R. P., Burdahl, P., Russo, R. E., and Garrison, S. M., "Laser Deposition of Biaxially Textured Yttria-stabilized Zirconia Buffer Layers on Polycrystalline Metallic Alloys for High Critical Current Y—Ba—Cu—O Thin-films," *Appl. Phys. Lett.,* 61, 2231-2233, 1992.
6. Wu, X. D., Foltyn, S. R., Arendt, P. N., Blumenthal, W. R., Campbell, I. H., Cotton, J. D., Coulter, J. Y., Hints, W. L., Matey, M. P., Safar, H. F., and Smith, J. L., "Properties of $YBa_2Cu_3O_x$ Thick Films on Flexible Buffered Metallic Substrates," *App. Phys. Lett.,* 1995, 67, 2397.
7. Hasegawa, K., Fujino, K., Mukai, H., Konishi, M., Hayashi, K., Sato, K., Honjo, S., Satao, Y., Ishii, H., and Iwata, Y., "Biaxially Aligned YBCO Film Tapes Fabricated by All Pulsed Laser Deposition", *Appl. Sppercond.*, 4, 475-486, 1996.
8. Goyal, A., Norton, D. P., Christen, D. K., Specht, E. D., Paranthaman, M., Kroeger, D. M., D. P., Budai, J. D., He, Q., List, F. A., Feenstra, R., Kerchner, H. R., Lee, D. F., Hatfield, E., Martin, P. M., Mathis, J., and Park, C., "Epitaxial Superconductors on Rolling-Assisted-Biaxially-Textured-Substrates (RABiTS); "A Route Towards high Critical Current Density Wire," *Applied Supercond.*, 1996, 69, 403-427.; A. Goyal et al., U.S. Pat. No. 5,739,086 and U.S. Pat. No. 5,741,377.
9. Norton, D. P., Goyal, A., Budai, J. D., Christen, D. K., Kroeger, D. M., Specht, E. D., He, Q., Saffian, B, Paranthaman, M., Klabunde, C. E., Lee, D. F., Sales, B. C., and List, F. A., "Epitaxial $YBa_2Cu_3O_x$ on Biaxially Textured Nickel (100): An Approach to Superconducting Tapes with High Critical current Density," Science, 1996, 274, 755.
10. Goyal, A., Norton, D. P., Kroeger, D. M., Christen, D. K., Paranthaman, M., Specht, E. D., Budai, J. D., He, Q., Saffian, B., List, F. A.; Lett, D. F., Hatfield, E., Martin, P. M., Klabunde, C. E., Mathis, J., and Park, C., "Conductors With Controlled Grain Boundaries: An Approach To The Next Generation, High Temperature Superconducting Wire," *J. Mater. Res.*, 1997, 12. 2924-2940.
11. Goyal, A., Norton, D. P., Budai, J. D., Paranthaman, M., Specht, E. D., Kroeger, D. M., Christen, D. K., He, Q., Saffian, B., List, F. A., Leo, D. F., Martin, P. M., Klabunde, C. E., Hatfield, E., and Sikka, V. K., "High Critical Current Density Superconducting Tapes By Epitaxial Deposition of $YBa_2Cu_3O_x$ Thick Films on Biaxially Textured Metals," *Appl. Phys. Lett.*, 1996, 69, 1795.
12. W. D. Sproul, "Physics and Chemistry of Protective Coatings," Ed. by W. D. Sproul, J. E. Greene, and J. A. Thornton (AIP Conf. Proc. No. 149, 1986, New York), p. 157.

OBJECTS OF THE INVENTION

There are a considerable number of problems and deficiencies associated with the prior art relating to the use and deposition of buffer layers on metal/alloy substrates, including those discussed above. There is a demonstrated need for such materials, layers, composites and related articles, together with related methods of preparation.

Accordingly, it is an object of the present invention to provide new and useful conducting and robust, nitride buffer layers on biaxially textured substrates, overcoming those various shortcomings and deficiencies of the prior art, including those described above.

It will be understood by those skilled in the art that one or more aspects of this invention can meet certain objectives, while one or more other aspects can meet certain other objectives. Each objective may not apply equally, in all instances, to every aspect of the present invention. As such, the following objects can be viewed in the alternative with respect to any one aspect of the present invention.

It is another object of the present invention to provide epitaxial nitride layers using a high rate deposition process.

It is yet another object of the present invention to provide epitaxial nitride layers using standard deposition techniques without the use of forming gas during deposition.

It is yet another object of the present invention to provide for the use of nitride layers as templates to grow epitaxial metal/alloy/ceramic and/or device layers.

It is yet another object to provide an alternate buffer layer technology for use in conjunction with the efficient, economical production of superconducting tapes.

Other objects, features and advantages of the present invention will be apparent from the foregoing, in light of the following summary and descriptions, and will be readily apparent to those skilled in the art having knowledge of various buffer layers, composites, articles and their methods of manufacture. Such objects, features, benefits and advantages will be apparent from the above as taken in conjunction with the accompanying examples, tables, data, and all reasonable inferences to be drawn therefrom.

SUMMARY OF THE INVENTION

In accordance with one aspect of the present invention, the foregoing and other objects can be achieved by a composite which includes a biaxially textured substrate having thereon a nitride layer.

In accordance with another aspect of the present invention, the foregoing and other objects are achieved by a biaxially textured article which includes a biaxially textured metal or alloy substrate having thereon an epitaxial nitride layer.

In accordance with yet another aspect of the present invention, the foregoing and other objects can be achieved by a biaxially textured article which includes a biaxially textured substrate having thereon an epitaxial nitride layer, the epitaxial nitride layer having thereon an epitaxial layer of an oxide such as, but not limited to, MgO, $CeO_2$, YSZ, $LaAlO_3$, $SrTiO_3$, $LaNiO_3$, $Y_2O_3$, $RE_2O_3$. ("RE" is an acronym used for any one of the Rare Earth elements, such as may be present in oxide form, including but not limited to those otherwise listed herein.)

In accordance with still yet another aspect of the present invention, the foregoing and other objects can be achieved by a composite or such article of manufacture which includes a biaxially textured substrate having thereon an epitaxial nitride layer, the epitaxial nitride layer having thereon an epitaxial layer of an oxide such as MgO, $CeO_2$, YSZ, $LaAlO_3$, $SrTiO_3$, $LaNiO_3$, $Y_2O_3$, $RE_2O_3$; the oxide layer having thereon an additional electromagnetic, epitaxial device layer such as, but not limited to, a superconducting layer.

In accordance with yet a further aspect of the present invention, a method of preparing a biaxially textured article comprising the steps of providing a biaxially textured substrate having a surface and depositing onto the surface, in the presence of nitrogen gas, a layer of a nitride; and further depositing on the nitride layer a layer of an oxide such as, but not limited to, MgO, $CeO_2$, YSZ, $LaAlO_3$, $SrTiO_3$, $LaNiO_3$, $Y_2O_3$, $RE_2O_3$.

In accordance with still a further aspect of the present invention, a method is provided by way of preparing a biaxially textured composite and/or article comprising the steps of providing a biaxially textured substrate having a surface and depositing onto the surface, in the presence of nitrogen gas, a layer of a nitride; and further depositing on the nitride layer a layer of an oxide such as, but not limited to, MgO, $CeO_2$, YSZ, $LaAlO_3$, $SrTiO_3$, $LaNiO_3$, $Y_2O_3$, $RE_2O_3$; and further depositing on the oxide layer an additional electromagnetic material layer such as a superconducting layer, en route to an integrated device.

A chemically new type of buffer layer, as can be used with rolling-assisted-biaxially-textured substrates, is disclosed herein. These buffer layers involve the use of mechanically tough and hard compounds which are also conducting. Such buffer layers have high electrical and thermal conductivity and hence will be superior for many electronic or other integrated applications where good electrical and thermal contact between the metal and the integrated device layer is required. Furthermore, a particular high speed deposition process is described, one which achieves epitaxy on a substrate without the use of noble metals or reducing atmosphere. Stoichiometric control allows tailoring of the lattice parameter so as to provide a good buffer between the lattice matched metal and the desired electronic/integrated layer.

As described elsewhere herein, the present invention provides a suitable substrate with a hard, wear-resistant coating which is also thermally and electrically conducting. With regard to thermal conductivity, the layers of this invention provide good contact between an overlaid superconducting layer and the substrate in the event of local loss of superconductivity, thereby providing thermal stabilization. With regard to the corresponding electrical properties, the layers of this invention provide a mechanism for current transfer between the substrate and a superconductor layer, thereby greatly decreasing the problems related to making sufficient electrical contacts to the conductor.

This invention, as evident from this summary, together with the following descriptions and examples, can be utilized with biaxially textured substrates. However, comparable results and benefits are available through use with untextured or randomly textured metal or alloy substrates. In addition to the nitride deposits/layers of this invention, the resulting articles can further include an oxide buffer layer of, but not limited to, MgO, $CeO_2$, YSZ, $LaAlO_3$, $SrTiO_3$, $LaNiO_3$, $Y_2O_3$, $RE_2O_3$. Alternatively, the untextured or randomly textured substrates can further include such an oxide buffer layer. Regardless, the resulting composite/article can also include an electromagnetic device and/or superconducting layer deposited thereon.

The methods of manufacture associated with this invention are much more time-efficient than those related methods of the prior art. Reactive sputtering of the type described herein, is a relatively rapid-process, with typical rates approaching 0.8 μm/min. Accordingly, the methods of this invention can be utilized to enhance the economics associated with production of long-length superconductors.

BRIEF DESCRIPTION OF THE DRAWINGS

FIG. 2 (b) The TiN (111) phi scan showed a full-width-half-maximum (FWHM) obtained by fitting a guassian curve to the data to be 6.6°. The FWHM is slightly better than that of the underlying Ni with a FWHM of ~7°. FIG. 3 (a) is created solely from orientation data. Variations in intensity in the figure is a reflection of pattern quality or intensity of the Kikuchi bands. Since BKD patterns from grain boundaries result in two superimposed patterns, grain boundaries in the sample are darker. Lastly, grain to grain contrast is a reflection of electron channeling contrast in this highly textured sample.

FIG. 3 (b) shows (111), (100) and (110) pole figures corresponding to the orientation data obtained from the region corresponding to FIG. 2 (a).

FIG. 4 (b) shows a TiN (100) pole plot from the pole figure shown in FIG. 2 (b).

DETAILED DESCRIPTION OF THE INVENTION

Figure 1:
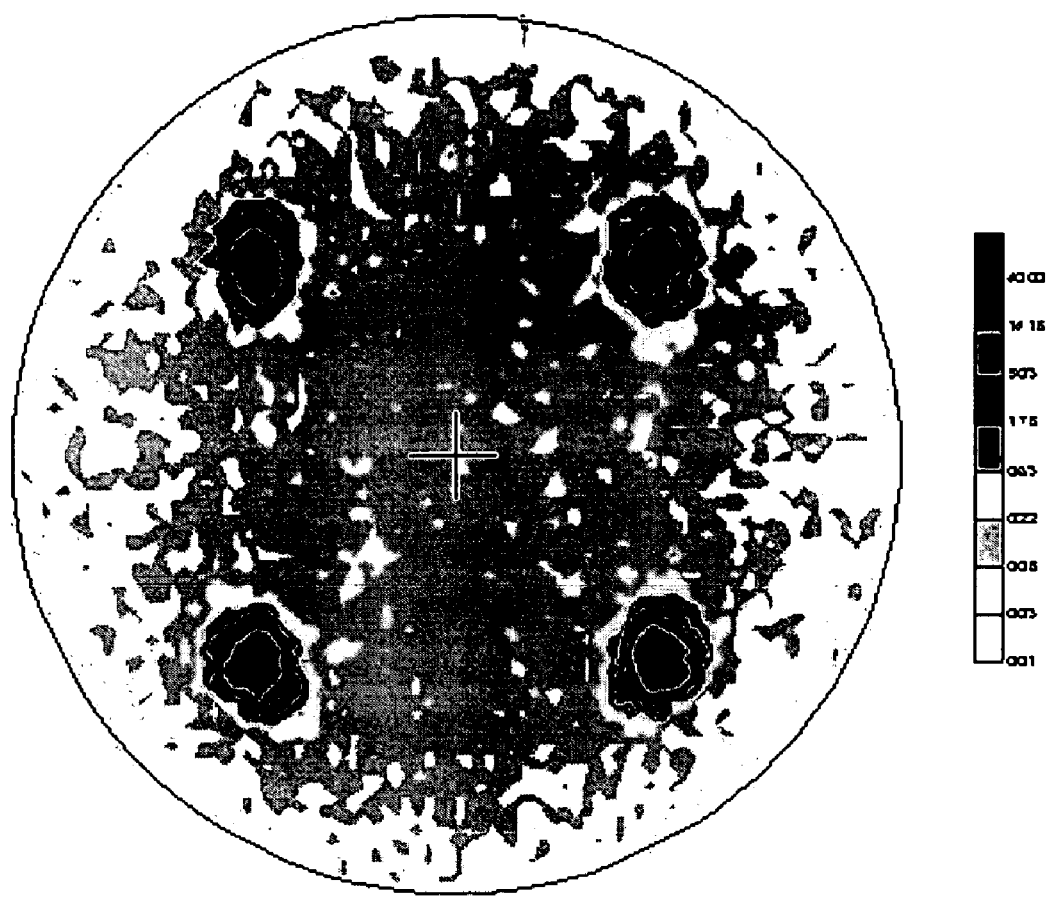
FIG. 1 shows a TiN (111) pole figure for a 3000 Angstrom thick TiN deposited on Ni using high-rate reactive sputtering. Only a single orientation, corresponding to the cube-on-cube epitaxy of TiN on the biaxially textured Ni is evident. The figure shows a log scale pole figure, which accentuates all minority texture components.

As mentioned above, the present invention includes a new method for the deposit of conducting and mechanically robust, epitaxial buffer layers using a scaleable and fast manufacturing process. In particular, epitaxial nitride buffer layers have been deposited for the first time using the methods of this invention.

The metal nitrides of the present invention have various properties and/or characteristics which lend themselves useful in conjunction with the structures, articles and/or composites described herein. For example:

a. Many metal nitrides exhibit a cubic symmetry with a range of lattice parameters suitable for the coated conductor application. Accordingly, these nitrides may be successfully deposited epitaxially on the nickel substrates and the YBCO layer can be epitaxially grown on the nitride buffer layers.

b. Refractory nitride coatings have been developed and used in the tool industry over several decades now, such that their manufacturibility in various configurations has already been demonstrated. High rate deposition of nitride coatings is being developed and used in many industrial applications.

c. Their extensive use as coatings in the tool industry is primarily due to inherent properties such as extreme hardness and wear resistance, chemical stability, high strength, high toughness and thermo-mechanical compatibility with many metals and alloys. Significant metal-metal bonding exists in these nitrides which induces enhanced strength, as compared to the oxides, such that crack-free coatings can be obtained.

d. The relatively high electrical and thermal conductivity of the nitrides are desired properties for buffer layers in electrical power applications. Nitrides typically have electrical resistivities at room temperature in the range of 10-20 μΩcm, an order of magnitude lower than that of YBCO at room temperature. In addition, they exhibit a metallic-like temperature dependence, providing a reduced resistivity as temperature is decreased. Hence, nitrides could electrically stabilize the conductor during transient loss of superconductivity in certain applications.

It can be shown that cube textured Ni has a resistivity comparable to that of oxygen free annealed Cu (OHFC Cu). Cube textured Ni has a very high residual resistivity ratio, RRR, specially the $RRR_{RT/4K}$. This indicates that if the current is shunted to the Ni substrate through the buffer layer, it will provide an effective shunt.

The transition metal (Ti, Nb, Zr, Hf, etc.) nitrides of this invention also exhibit extensive compositional range with complete solid solubility with and among most of them. The compositional flexibility and chemical compatibility among these nitrides can be used favorably to tailor several properties required for the buffer layer. For example, the lattice parameter variation among the various nitrides is quite wide (Table I) such that appropriate nitride compositions can be identified. Note that for the rare-earth-nitride lattice parameters of ≈5 Å, a 45° rotation of the unit cell yields an effective lattice parameter of ≈3.53 Å, which matches well with both Ni and YBCO. If desired, the nitride composition could be graded to fit the cell constants at both substrate/nitride and nitride/YBCO interfaces. This should significantly alleviate interfacial stresses due to lattice mismatch and provide a "near-strain-free" template for YBCO deposition.

As can be seen from Table 1, the buffer compounds of this invention are strong and stiff, and have a high thermal conductivity as well as a low electrical resistivity. The thermal expansion coefficients of these representative materials are also relatively low and, for instance, close to the thermal expansion of YBCO in the basal plane. The lattice parameter of some of these compounds is close to that of YBCO (3.826 A). LaN is most promising in this regard with a half diagonal length in the cube face being 3.748 A.

The present invention provides a method for fabricating conducting and mechanically robust nitride buffer layers on biaxially textured substrates. The invention also discloses a high rate deposition method to achieve the same. The invention also discloses a specific deposition method without the use of forming gas during the deposition.

It is found that high rate deposition using reactive sputtering of metals in a nitrogen atmosphere over a wide range of substrate temperature, results in epitaxial nitride layers on reactive, biaxially textured metals such as Ni. The sputtering target can be made is made of a pure metal, for example Ti, or ceramic target such as TiN.

EXAMPLES OF THE INVENTION

The following non-limiting examples and data illustrate various aspects and features relating to the buffer layers, composites, articles and methods of this invention, including the surprising and unexpected utility of the nitride materials described herein; in particular, (a) the good electrical and thermal conductivity thereof and compatability with subsequent materials and/or layers used in conjunction therewith, and (b) the high rate of deposition as compared to prior art oxides such conductivity, method and related structural and processing benefits not otherwise expected. Comparable utility and advantages can be realized using various other embodiments, consistent with this invention.

Example 1

Magnetron sputtered TiN films were grown at a substrate temperature of 700° C. on biaxially textured nickel substrates at a deposition rate of 1.5 Angstrom/sec. The films had a thickness of 300 nm. The films showed a remarkably low in-plane and out-of-plane alignment, FIG. 1 shows a TiN

TABLE I

Properties of Refractory Cubic Nitrides

| Material | Cell Constant (Å) | CTE (ppm/° C.) | Thermal Conductivity (W/m · K) | Young's Modulus (Gpa) | Micro-Hardness (kg/mm$^2$) | Electrical Resistivity (μΩcm$^{-1}$) |
|---|---|---|---|---|---|---|
| VN | 4.14 | 8.1 | 5.2 | 460 | 1500 | 85 |
| (Ti,Al)$_{0.5}$N | 4.165 | | | | | |
| TiN | 4.235 | 8.1 | 22 | 600 | 2000 | 20-30 |
| (Ti,Zr)$_{0.5}$N | 4.394 | | | | | |
| ZrN | 4.57 | 5.9 | 10 | 500 | 1500 | 21 |
| HfN | 4.526 | 6.5 | 17 | | 1600 | 32 |
| NbN | 4.39 | 10 | | 480 | 1400 | 58 |
| YN | 4.87 | | | | | |
| CeN | 5.02 | | | | | |
| NdN | 5.15 | | | | | |
| LaN | 5.301 | | | | | |
| YSZ | 5.15 | 10 | | | | |
| CeO$_2$ | 5.412 | | | | | |
| Nickel | 3.524 | 11 | | | | |
| YBCO | 3.86 | 13 | | | | |

Figure 2:
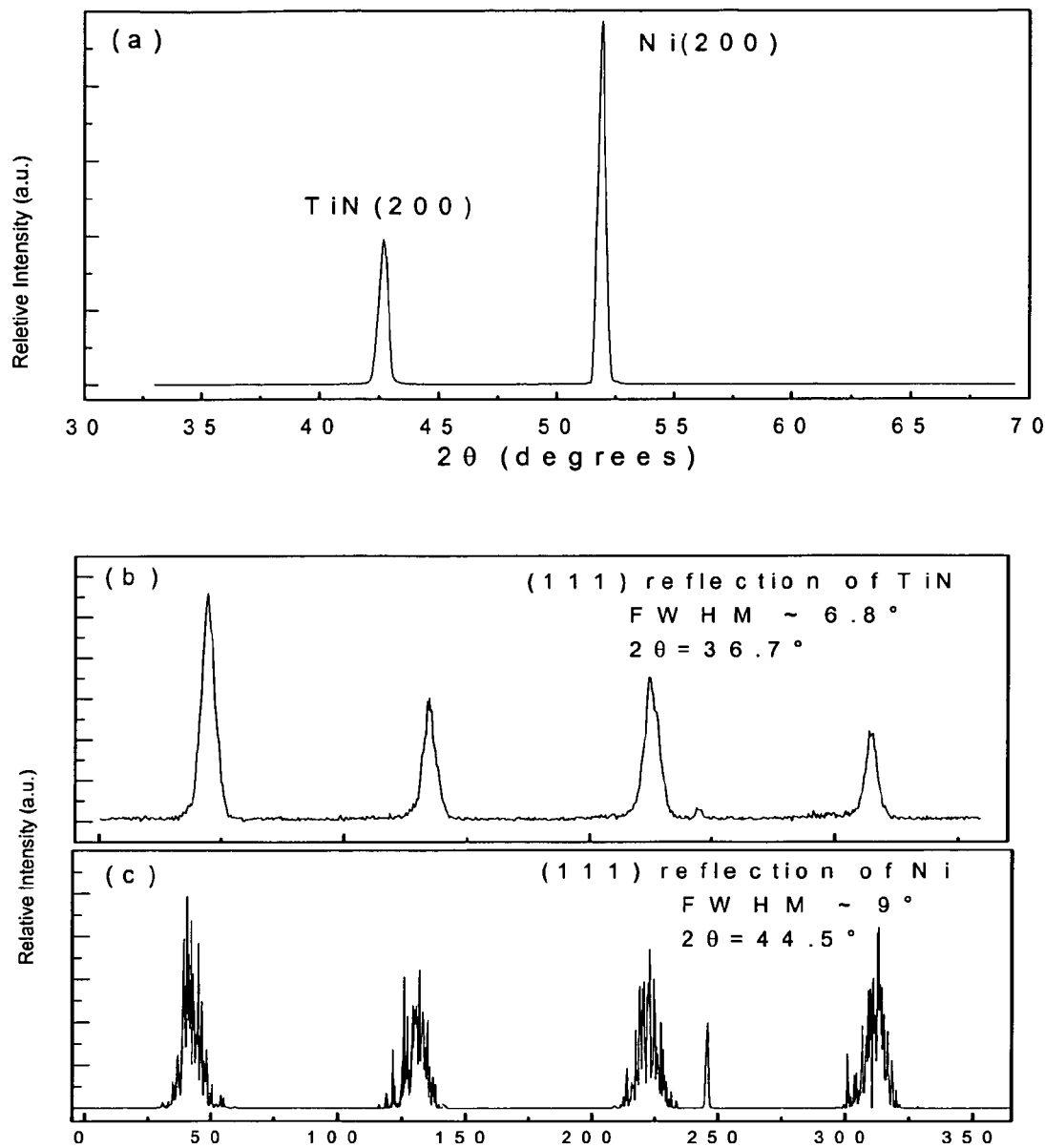
FIG. 2 (a) shows a XRD θ-2θ scan from TiN on Ni. The inset in FIG. 2 (a) compares the rocking curves or the out-of-plane texture of the TiN layer and Ni. TiN (002) rocking curve FWHM was found to be 3.9° and 6.7° in and about the rolling direction. This is almost 2° sharper than the underlying Ni substrate.
Figure 3:
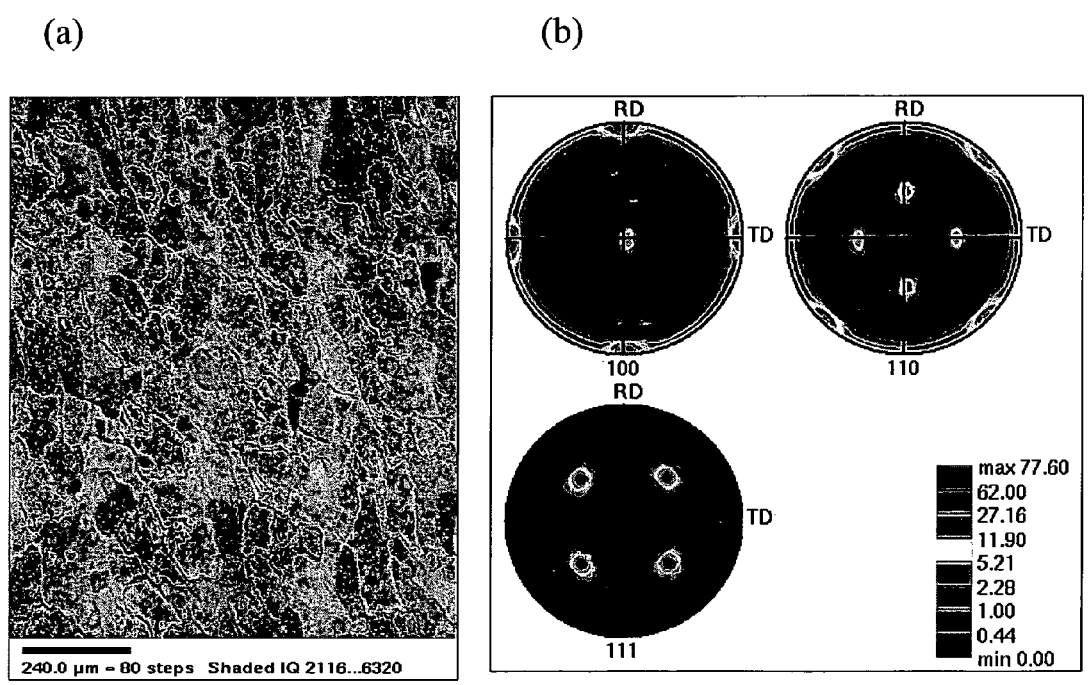
FIG. 3 (a) shows an orientation image micrograph of TiN/Ni. Backscatter Kikuchi Disfraction (BKD) patterns were obtained in a hexagonal grid with a step size of 4 μm from the surface of the TiN layer. Patterns are obtained from every macroscopic region of the substrate, ~1 mm×1 mm, and correspond to over 200,000 diffraction patterns. At each point the pattern was indexed to give a unique measure of the three-dimensional orientation. A hypothetical hexagonal grid was then superimposed on the pattern grid and all resulting grain boundary misorientations calculated.
Figure 4:
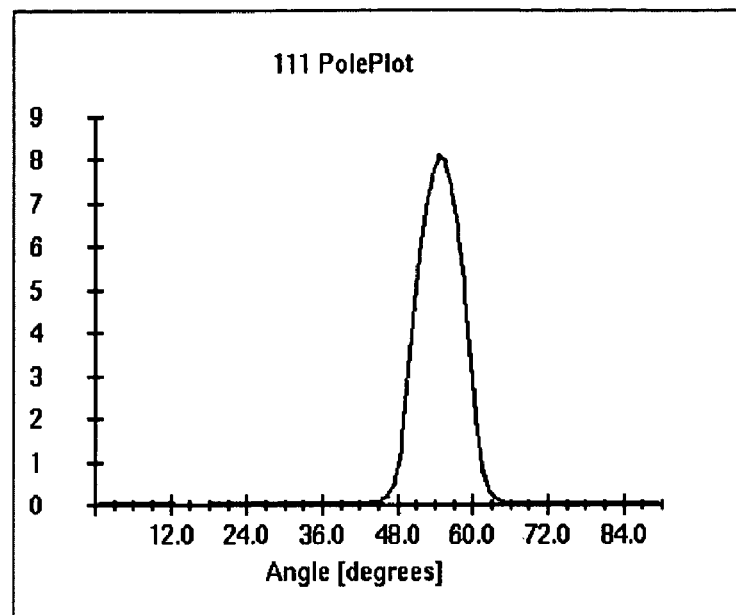
FIG. 4 (a) shows a TiN (111) pole plot from the pole figure shown in FIG. 2 (b).
Figure 4:
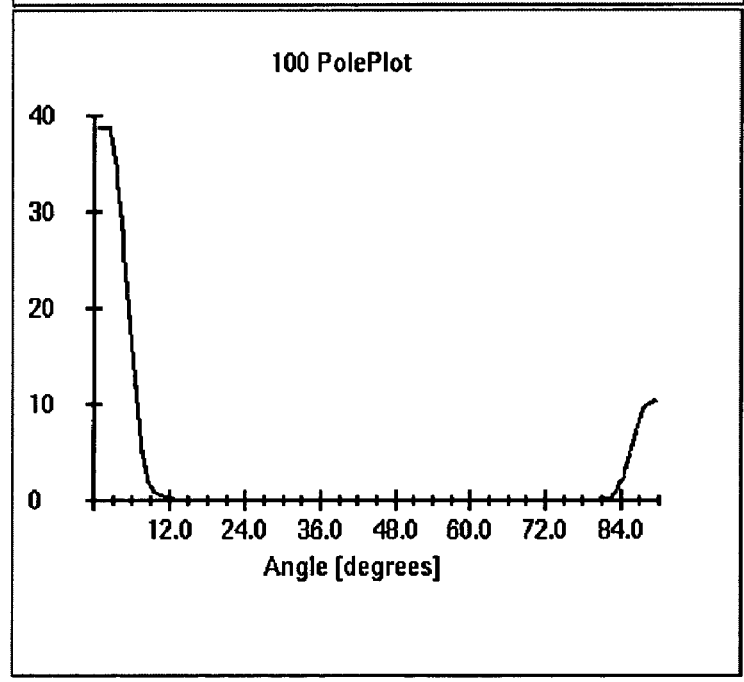

(111) pole figure. The existence of only four peaks demonstrates a single epitaxial orientation. The location of the peaks in the (111) pole figure is consistent with a cube-on-cube epitaxial relationship. The TiN (111) phi scan in FIG. 2 (b) to (d) showed a full-width-half-maximum (FWHM) obtained by fitting a guassian curve to the data to be 6.6°. The FWHM is slightly better than that of the underlying Ni with a FWHM of ~7°. The rocking curves or the out-of-plane texture of the TiN layer was found to be 3.9° and 6.7° in and about the rolling direction. This is almost 2° sharper than the underlying Ni substrate. FIG. 3a shows an electron backscatter Kikuchi diffraction (BKD) created image from the surface of the TiN on Ni. The image was obtained by obtaining 200,000 diffraction patterns in a hexagonal grid from the TiN layer. The grain structure of the TiN clearly resembles that of the Ni substrate below, indicating excellent epitaxy. FIG. 3b shows (111), (100) and (110) pole figures corresponding to the orientation data obtained from the region corresponding to FIG. 3a. Again excellent epitaxy is evident. FIGS. 4 (a) and b show the intensity of the (111) and (200) poles in the pole figures corresponding to FIG. 3b. The FWHM of both the (111) pole plot corresponding to the in-plane texture and of the (100) plot corresponding to the out-of-plane texture are consistent with the macroscopic X-ray texture.

Figure 5:
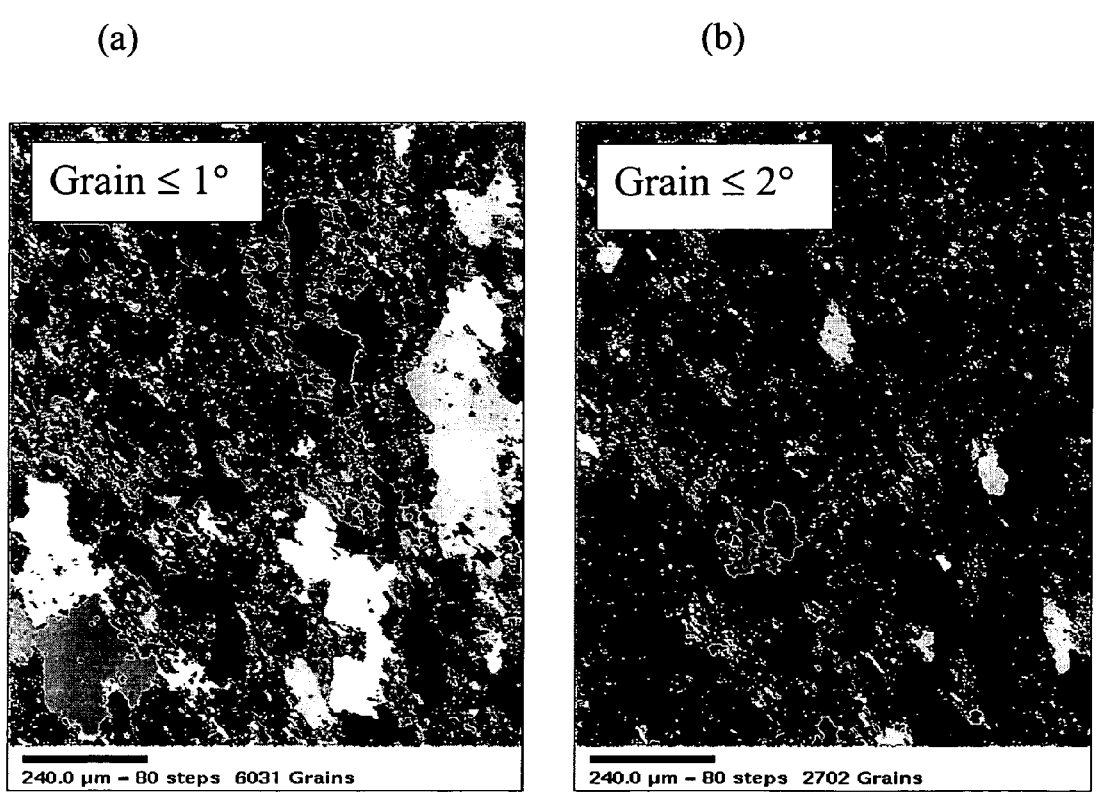
FIG. 5 shows orientation image micrographs (OIM) images corresponding to FIG. 2 (a), with the grains shaded according to the criterion that a single color represents a contiguous or percolative region of orientation changes less than 1° and 2° respectively. It can be seen that most of the substrate is percolatively connected within 2.
Figure 6:
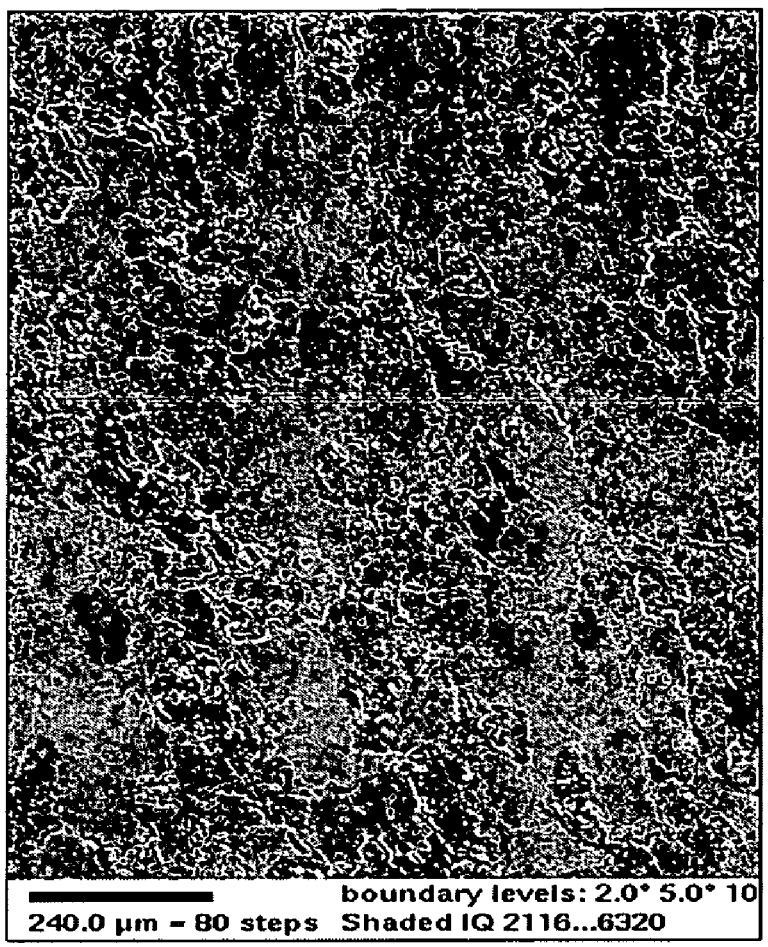
FIG. 6 shows an orientation image micrograph from FIG. 2 (b), with superimposed color coded grain boundaries. Green boundaries correspond to misorientation changes greater than 1° but less than 5°, yellow boundaries correspond to misorientation changes greater than 5° but less than 10°, and red boundaries correspond to misorientation changes greater than 10°. It is clear that primarily low angle boundaries are present.

In order to visualize percolation of current flow should an epitaxial superconducting film be grown on such a substrate, FIG. 5 shows coloring of the same region shown in FIG. 3a. In FIG. 5, grains have been colored according to the criterion that a single color represents a contiguous or percolative region of orientation changes less than or equal to 1° and 2° respectively. It can be seen that most of the substrate is percolatively connected within 2°. One can also highlight grain boundary misorientations in the TiN layer. FIG. 6 shows color coded grain boundaries superimposed on the image shown in FIG. 2 (b). Three types of grain boundaries are indicated in the figure; green boundaries denote boundaries with misorientations greater than 1° and less than 5°, yellow lines denote boundaries with misorientations greater than 5° and less than 10° and red boundaries denote boundaries with misorientations greater than 10°.

Figure 7:
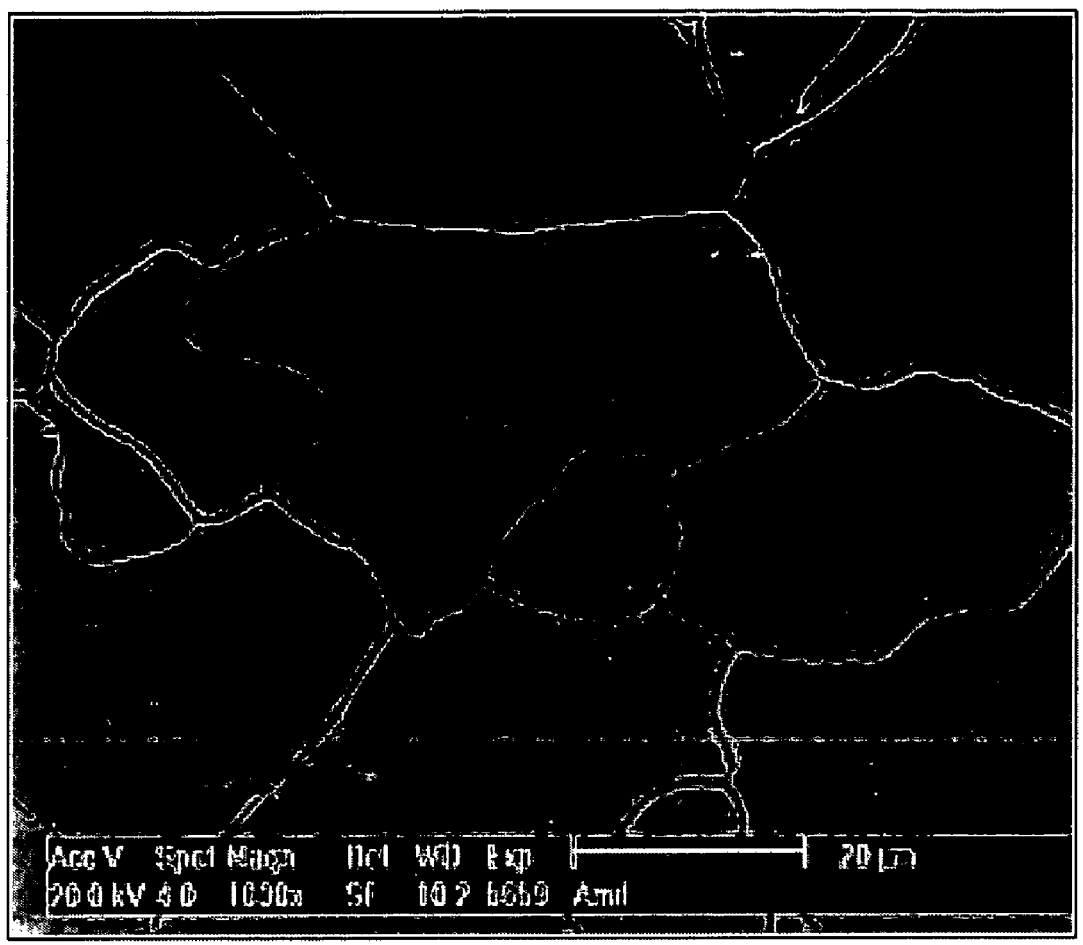
FIG. 7 shows a high magnification scanning electron micrograph of the surface of TiN deposited epitaxially on biaxially textured Ni. No evidence of any microcracks can be seen. This is expected because of the high mechanical toughness of TiN.

FIG. 7 shows a scanning electron micrograph from the surface of TiN on Ni. No evidence of microcracking is seen. Even for the case of thicker TiN layers, no cracks are observed.

The above results suggest the following:

Excellent epitaxy of TiN can be obtained on biaxially textured Ni using high-rate, reactive sputtering.

The out-of-plane texture of the TiN layer is found to be significantly improved indicating a smoother film morphology than the starting Ni substrate.

The TiN surface showed an excellent crystallinity considering well formed BKD patterns which are only formed from a thin surface region of the substrata were obtained.

TiN films are smooth with no evidence of any microcracking.

Percolation within 2° in macroscopic regions of the substrate. Should YBCO be deposited epitaxially on this layer, its critical current density will not be limited by grain boundary misorientations.

Similarly any other cubic nitride thin film of compositions listed in Table 1 can be deposited epitaxially on biaxially textured metal substrates or other substrates such as IBAD substrates, as well as some single crystal substrates.

Example 2

Demonstrating the methods and related aspects of this invention, magnetron sputtered TiN films are grown at a substrate temperature of 700° C. on biaxially textured IBAD substrates with a YSZ IBAD layer on metallic substrate at a deposition rate of 1.5 Angstrom/sec. The films had a thickness of 300 nm. Measurement of the epitaxy, i.e., the in-plane and out-of-plane texture showed excellent epitaxy.

Example 3

Figure 10:
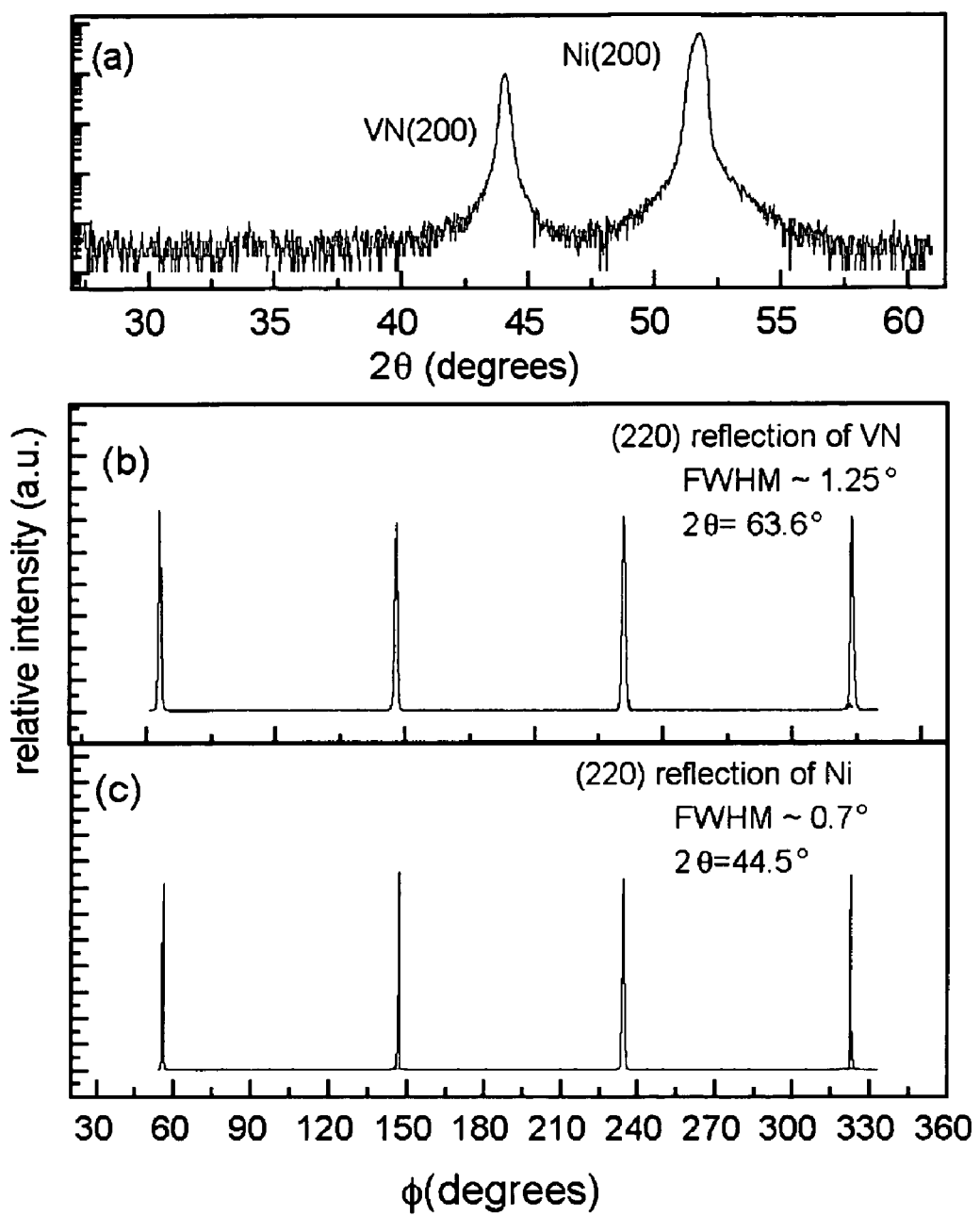
FIG. 10 shows a θ-2θ scan from a VN film grown on single-crystal Ni (001). Also shown are phi-scans of the out-of-plane (220) reflections from (b) the VN layer and (c) the Ni substrate.
Figure 11:
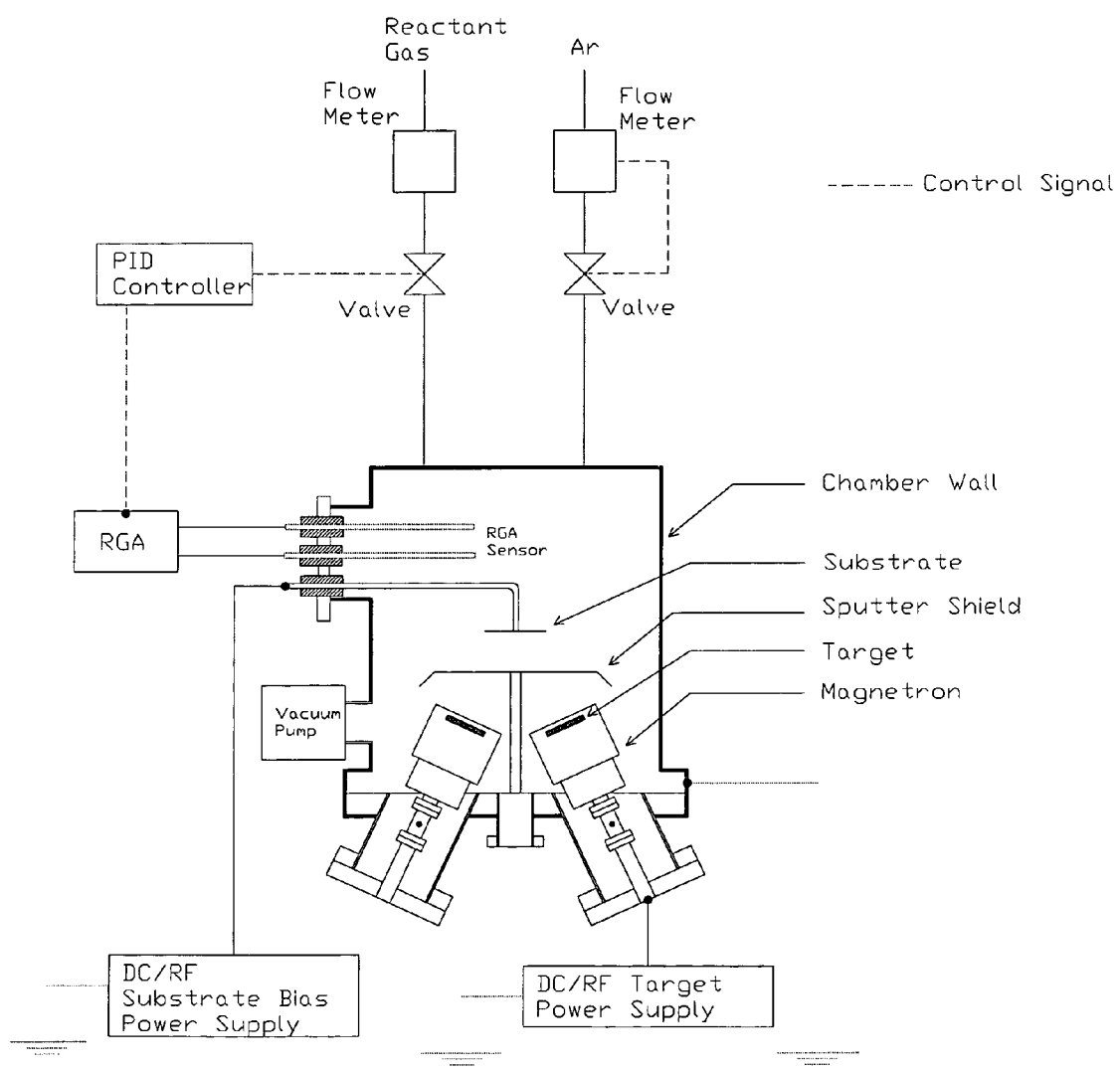
FIG. 11 is a schematic representation of a UHV reactive magnetron sputtering chamber of the type that can be used with this invention.

Single crystal VN films were grown on single crystal Ni substrates using reactive magnetron sputtering at a substrate temperature of 600° C. FIG. 10(a) is a θ-2θ x-ray diffraction (XRD) scan of a VN film grown on Ni, showing only VN (002) and Ni (002) peaks. The φ-scan of the VN (220) peaks in FIG. 10(b), compared with Ni (220) in FIG. 10(c) verifies cube-to-cube epitaxial deposition of VN. Excellent quality of nitride layer were indicated by the FWHM of VN (220) reflection, ~1.1°, close that of single crystal Ni, ~0.7°. This results proves that the biaxial texture of nitride layer is limited by texture of underlying Ni substrate with the nitride deposition process used.

For further growth of a superconducting oxide, a transitional oxide buffer layer is required to transfer the opitaxy from the nitride layer. Thin over layers of epitaxial oxides (between TiN and YBCO) including MgO, $CeO_2$ and YSZ can be successfully deposited using electron beam evaporation, sputtering; and pulsed laser ablation. YBCO was subsequently deposited using pulsed laser ablation (PLD). These are shown in the examples below.

Example 4

Figure 8:
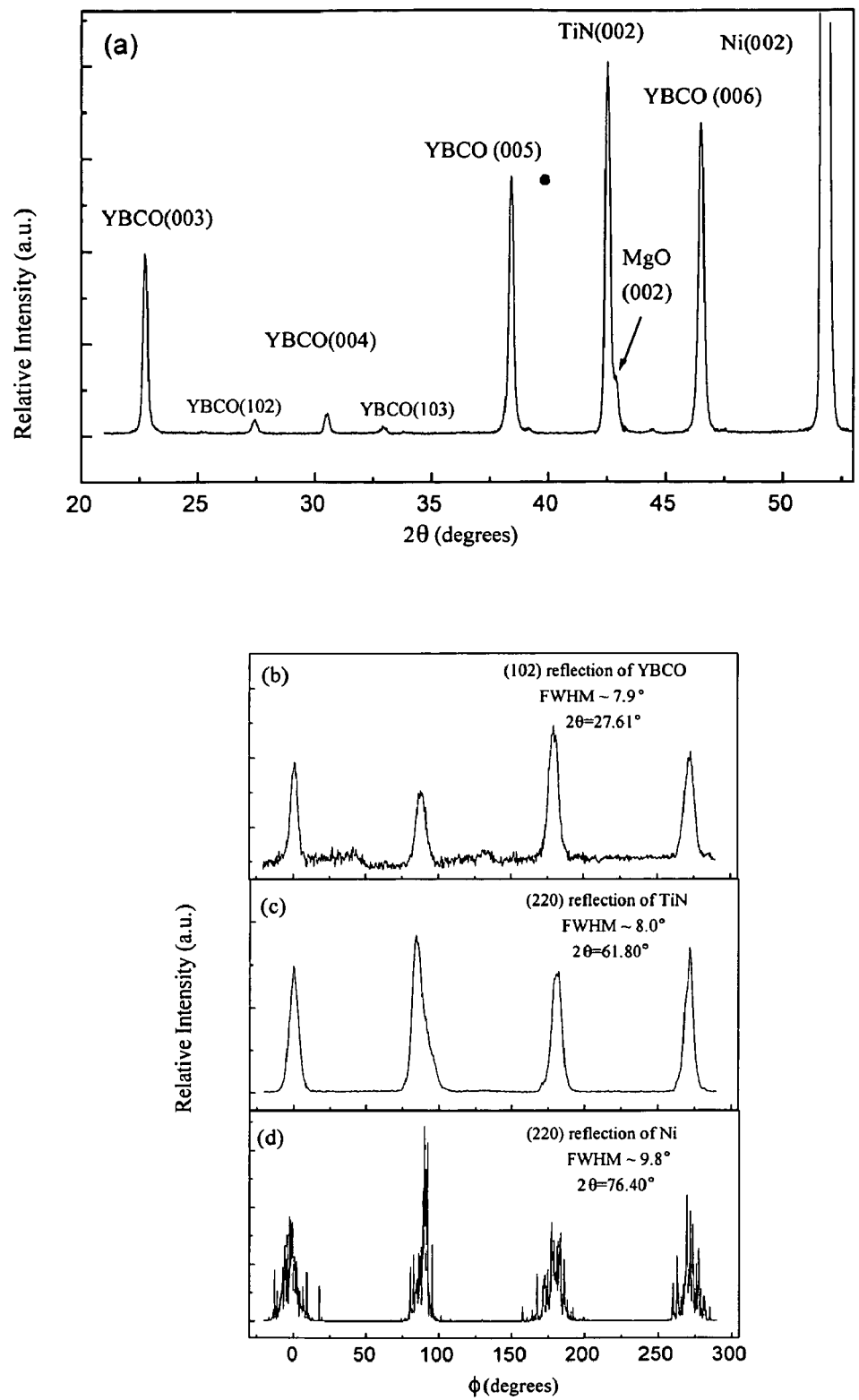
FIG. 8 (a) shows a X-ray diffraction θ-2θ scan from a YBCO/MgO/TiN/Textured Ni sample showing excellent orientation; and shows phi-scans of (b) YBCO (102), (c) TiN (220) and (d) Ni (220) reflections, respectively indicating the transference of the in-plane texture. The position of the peaks verifies cube-on-cube epitaxy between the YBCO, MgO, TiN, and Ni. The phi-scan FWHM values were 7.9° and 8° for YBCO and TiN, respectively. Note that these values are lower than those of the textured Ni (≈9.8°). The value for YBCO is typically consistent with high $J_c$ values.

Sputtered TiN films were grown at a substrate temperature of 700° C. on biaxially textured nickel substrates at a deposition rate of 1.5 Angstrom/sec. The films had a thickness of 300 nm. The films showed a remarkably low in-plane and out-of-plane alignment. A thin over layer of 500 Angstroms of MgO was deposited using electron beam evaporation. PLD was used to deposit YBCO on MgO at 750° C. YBCO films had a thickness of ~0.5 μm. FIG. 8(a) is a θ-2θ x-ray diffraction (XRD) scan of the YBCO/MgO/TiN/Ni multilayer sample. The primary peaks are that corresponding to TiN (002), MgO (002), Ni (002), and YBCO (001). This indicates the out-of-plane orientation expected for the epitaxial multilayer structure. A small YBCO (102) and (103) peaks were also present, indicating that only a small fraction of the YBCO was not epitaxial. In order to uniquely determine the epitaxy, it is necessary to measure phi-scans and rocking curves from the multilayer structure. The phi-scan of the Ni (220) reflection in FIG. 8(d) indicated a FWHM of ~9.8°. The phi-scan of the TiN (220) reflection in FIG. 8(c) indicated a FWHM of ~8°. The phi-scan of the YBCO (220) reflection in FIG. 8(b) indicated a FWHM of ~7.9°.

Figure 9:
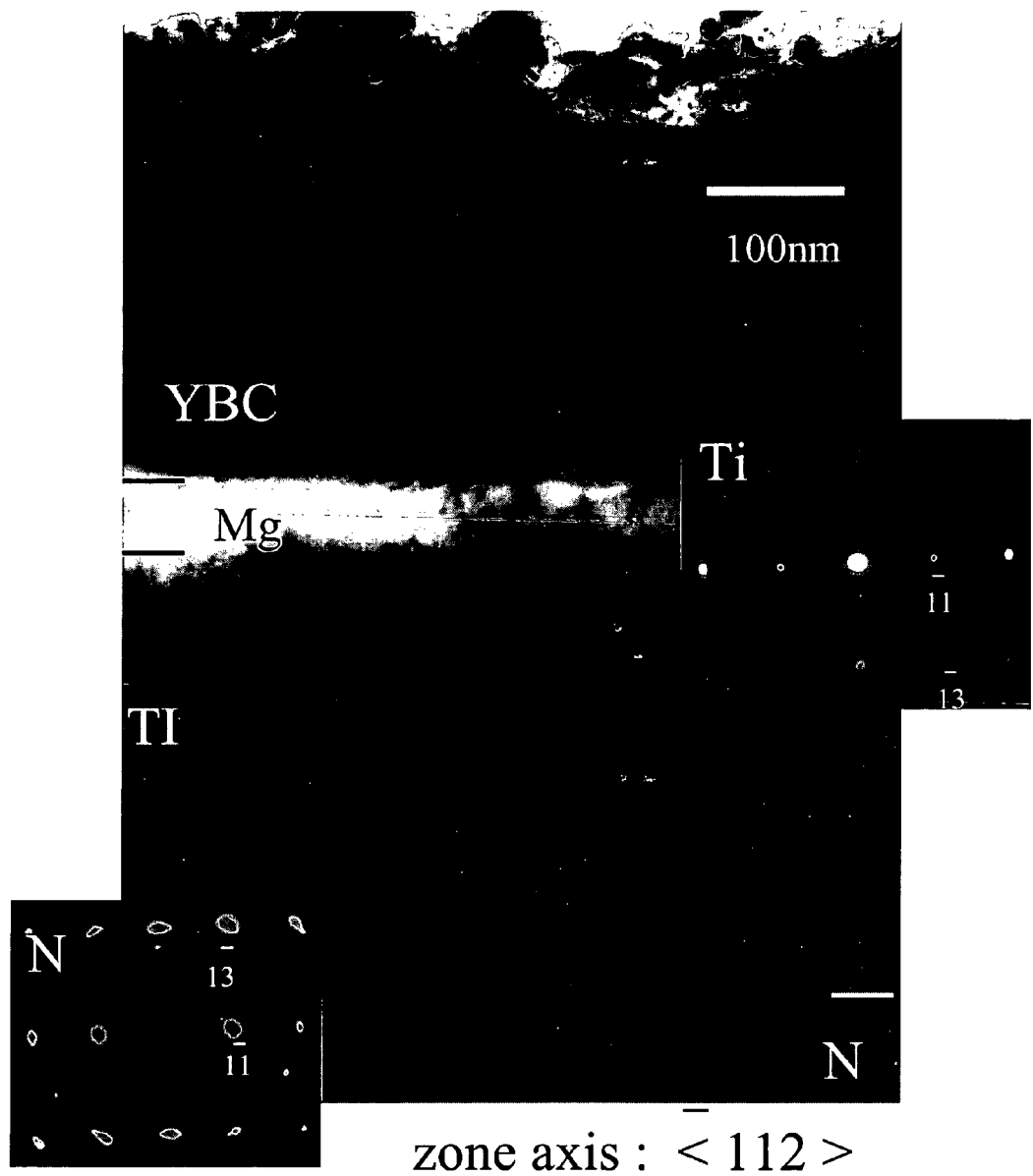
FIG. 9 shows a cross-sectional TEM image of a YBCO/MgO/TiN/Textured Ni structure. The insets show diffraction patterns from TiN and Ni.

FIG. 9 shows a low-resolution cross-sectional transmission electron microscope (XTEM) image of a YBCO/MgO/TiN/Ni structure. A cross section TEM bright field image shows the textured Ni substrate and three distinct layers. The image was taken with the electron beam along the MgO [112] direction. The MgO layer and Ni substrate appear slightly lighter than the TiN and YBCO layer because of the lower scattering factor of Mg and Ni. The layers are relatively planar and the contrast of image shows sharp interfaces between the layers. This suggests that there was little interdiffusion, interfacial reaction, or oxidation in the structure, in spite of the elevated growth temperatures of TiN, MgO, and YBCO. The diffraction pattern in the inset also verifies the crystal symmetry with d-spacings corresponding B1-TiN and FCC Ni, and indicates good-quality epitaxy.

Example 5

TiN was deposited at a substrate temperature of 200 C using reactive sputtering of a Ti target in a $N_2$ atmosphere, on a biaxially textured Ni substrate. Clear evidence of epitaxy is found to occur. YBCO can now be deposited on this layer. It is important to note that the TiN can be deposited directly on the Ni without the presence of a reducing atmosphere (i.e. forming gas). In some cases, it might be necessary to deposit one or more buffer layers between the TiN layer and the electronic device layer of interest.

Example 6

Solid solution mixture of two or more metals can be reactively sputtered in a $N_2$ atmosphere to form an alloy nitride coating. Such coatings, in accordance with the present invention, may be required for some applications where tailoring of lattice parameters is required.

Further examples of the present invention are described as methods of preparing a biaxially textured substrate by the following steps:

Step 1) Depositing onto a surface of a substrate, with or without the presence of nitrogen gas, an epitaxial metal nitride layer of a metal nitride that includes at least one of: Ti, Ce, Zr, Hf, V, Nb, Nd, La, and Al;

Step 2) Depositing onto the epitaxial metal nitride layer at least one oxide layer that includes at least one of MgO, $CeO_2$, YSZ, $LaAlO_3$, $SrTiO_3$, $BaPbO_3$, $LaNiO_3$, $Y_2O_3$, and $RE_2O_3$; and Step 3) Depositing onto the oxide layer at least one electromagnetic device layer such as a superconducting oxide layer, for example.

While the principles of this invention have been described in connection with specific embodiments, it should be understood clearly that the descriptions, along with the chosen tables, graphs and data therein, are made only by way of example and are not intended to limit the scope of this invention in any manner. For example, a variety of suitable substrates can be utilized, in particular those understood as having utility in the preparation of various superconducting devices. Likewise, a variety of reaction/deposition conditions and parameters can be employed, as would be understood from the present invention with a straight-forward extension thereof, as would be known by those individuals skilled in the art and made aware of this invention. Other advantages and features of this invention will become apparent from the claims made to the invention, with the scope thereof determined by the reasonable equivalents, as would be understood by those skilled in the art.

We claim:

1. A method of preparing a biaxially textured substrate comprising:
   providing a biaxially textured substrate having a surface;
   depositing onto said surface, with or without the presence of nitrogen gas, an epitaxial metal nitride layer comprising at least one metal selected from the group consisting of Ti, Ce, Zr, Hf, V, Nb, Nd, La, and Al;
   depositing onto said layer at least one oxide layer selected from the group consisting of MgO, $CeO_2$, YSZ, $LaAlO_3$, $SrTiO_3$, $BaPbO_3$, $LaNiO_3$, and $RE_3O_3$; and
   depositing onto said surface of said oxide layer at least one electromagnetic device layer, said layer comprising a superconducting oxide layer.

2. A method in accordance with claim 1 wherein said biaxially textured substrate has {100}<100> orientation texture.

3. A method in accordance with claim 1 wherein the substrate is a biaxially textured metal or alloy.

4. A method in accordance with claim 1 wherein the substrate is biaxially textured Ni or a Ni alloy.

5. A method in accordance with claim 1 wherein the substrate is a single crystal metal substrate.

6. A method in accordance with claim 1 wherein the deposition is performed using magnetron sputtering.

7. A method in accordance with claim 1 wherein the deposition is performed using electron beam evaporation.

8. A method in accordance with claim 1 wherein the deposition is performed using pulsed laser ablation.

9. A method in accordance with claim 1 wherein the deposition is performed using sol-gel deposition.

* * * * *